United States Patent [19] [11] Patent Number: 5,017,515
Gill [45] Date of Patent: May 21, 1991

[54] PROCESS FOR MINIMIZING LATERAL DISTANCE BETWEEN ELEMENTS IN AN INTEGRATED CIRCUIT BY USING SIDEWALL SPACERS

[75] Inventor: Manzur Gill, Arcola, Tex.

[73] Assignee: Texas Instruments Incorporated, Dallas, Tex.

[21] Appl. No.: 415,807

[22] Filed: Oct. 2, 1989

[51] Int. Cl.$^5$ .............. H01L 21/00; H01L 21/02; H01L 21/90
[52] U.S. Cl. .................. 437/229; 437/52; 437/53; 357/24; 430/312; 156/659.1; 156/661.1
[58] Field of Search ............... 437/52, 53, 229; 357/24, 24 LR; 148/DIG. 137; 430/312; 156/659.1, 661.1

[56] References Cited
U.S. PATENT DOCUMENTS

| 4,113,515 | 9/1978 | Kooi et al. | 357/24 |
| 4,227,202 | 10/1980 | Tasch, Jr. et al. | 437/53 |
| 4,228,445 | 10/1980 | Tasch, Jr. et al. | 437/53 |
| 4,574,468 | 3/1986 | Slotboom et al. | 357/24 |
| 4,619,039 | 10/1986 | Maas et al. | 437/53 |
| 4,766,089 | 8/1988 | Davids et al. | 437/229 |

FOREIGN PATENT DOCUMENTS 0244882 10/1988 Japan .................. 437/53

OTHER PUBLICATIONS

Ho, I., Fabrication of High-Density Charge-Coupled Devices with Self-Isolated Clock Lines, IBM Tech. Dis. Bull., vol. 15, No. 3, 8/1972, pp. 1052-1053.

Primary Examiner—Brian E. Hearn
Assistant Examiner—B. Everhart
Attorney, Agent, or Firm—Theodore D. Lindgren; Melvin Sharp; Thomas W. Demond

[57] ABSTRACT

The process of this invention includes forming and patterning a first layer of photoresist to form first lines of photoresist having substantially minimum lithographic widths, forming first elements between the first lines of photoresist, removing the photoresist, forming a sidewall member on each side edge of the first elements, forming a second layer over the structure, and etching to electrically insulate the first elements and the second elements at the sidewalls. Alternatively, the structure is coated with another layer of photoresist after formation of sidewall member on each side of the first elements. The layer of photoresist is patterned to form second photoresist lines that cover alternating sidewall members. The exposed sidewall members are removed. Strips are formed between the second photoresist lines. After removal of the second photoresist lines, the structure is etched as before. However, in this embodiment, lateral extensions of the first elements are formed. The combined elements are separated by the remaining sidewall members.

14 Claims, 9 Drawing Sheets

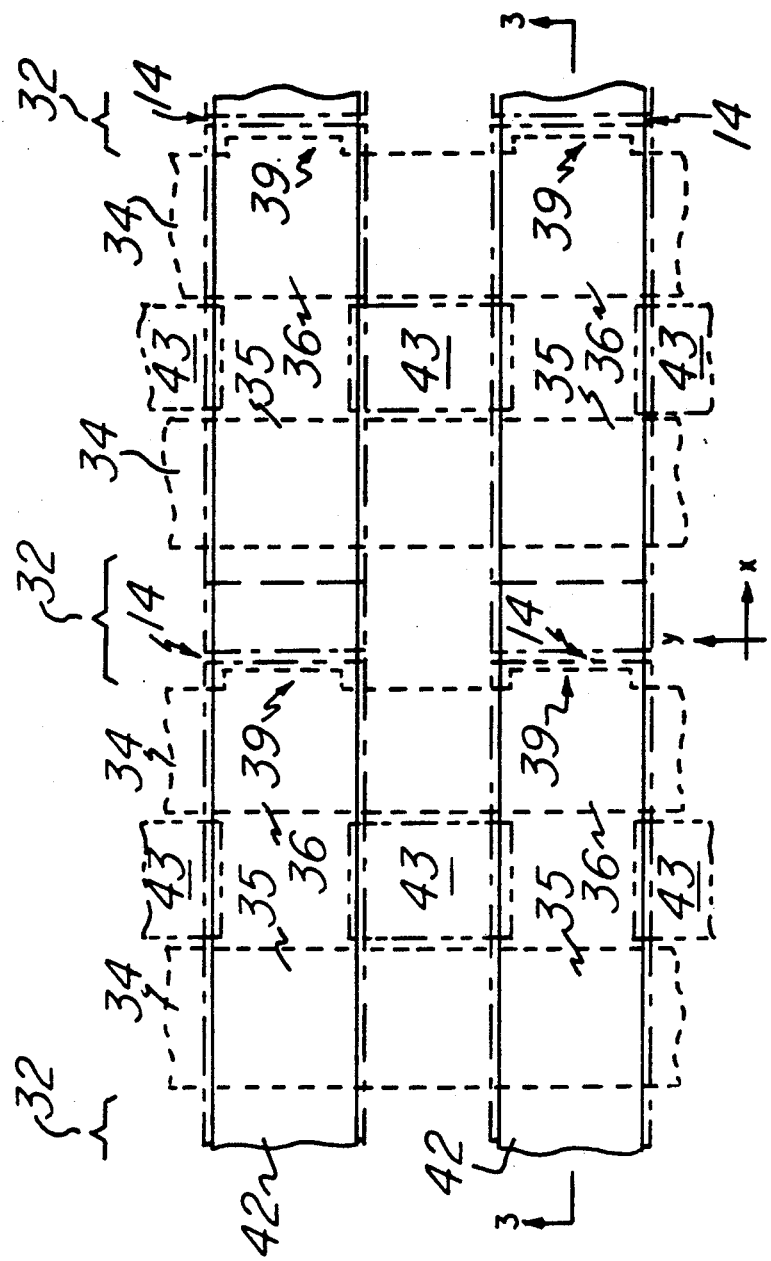

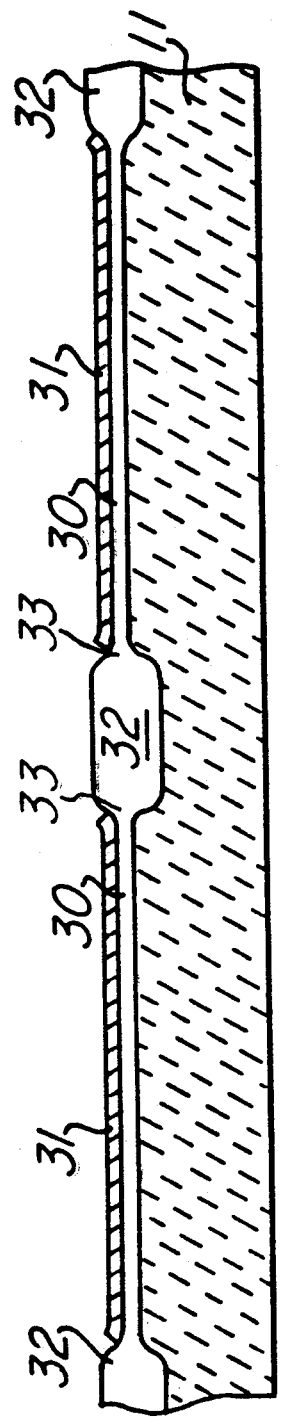
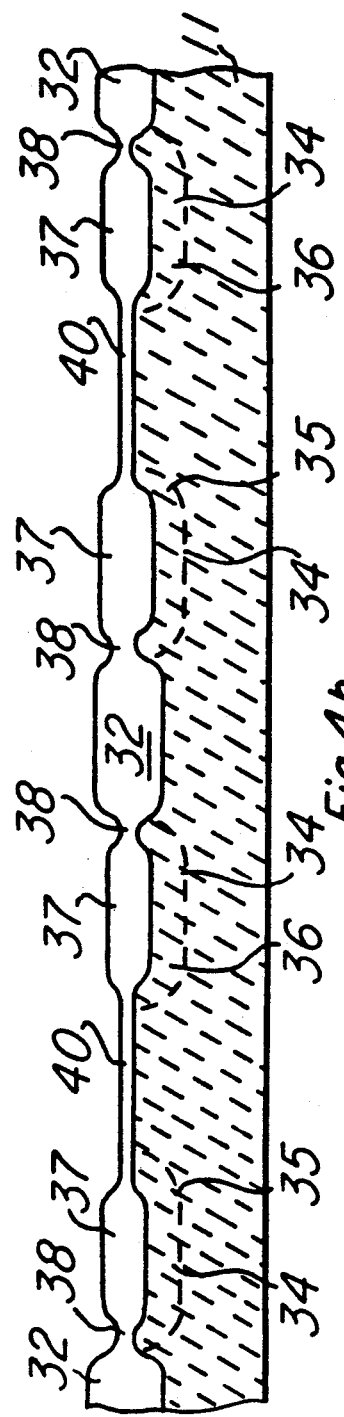

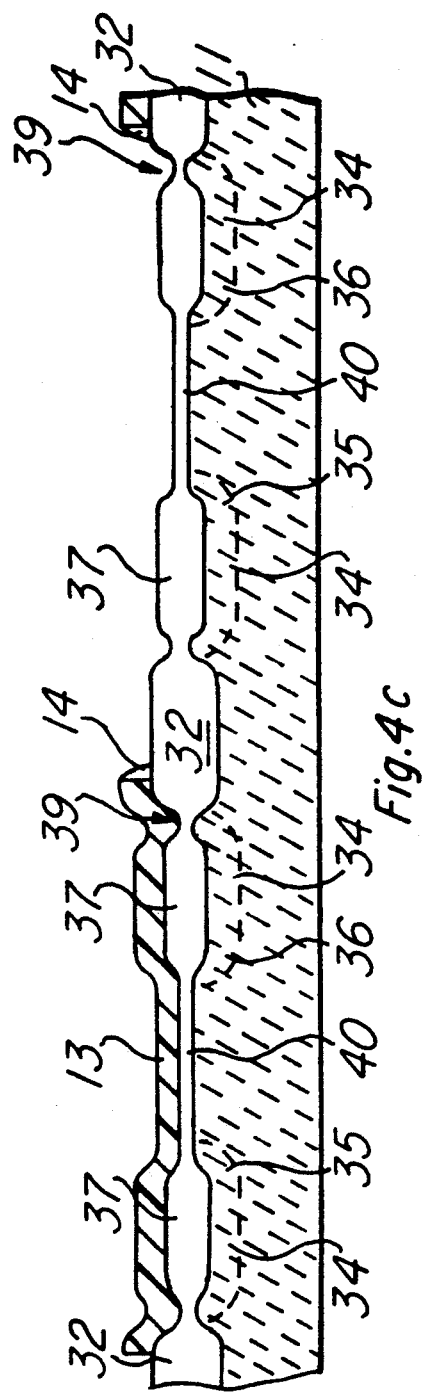
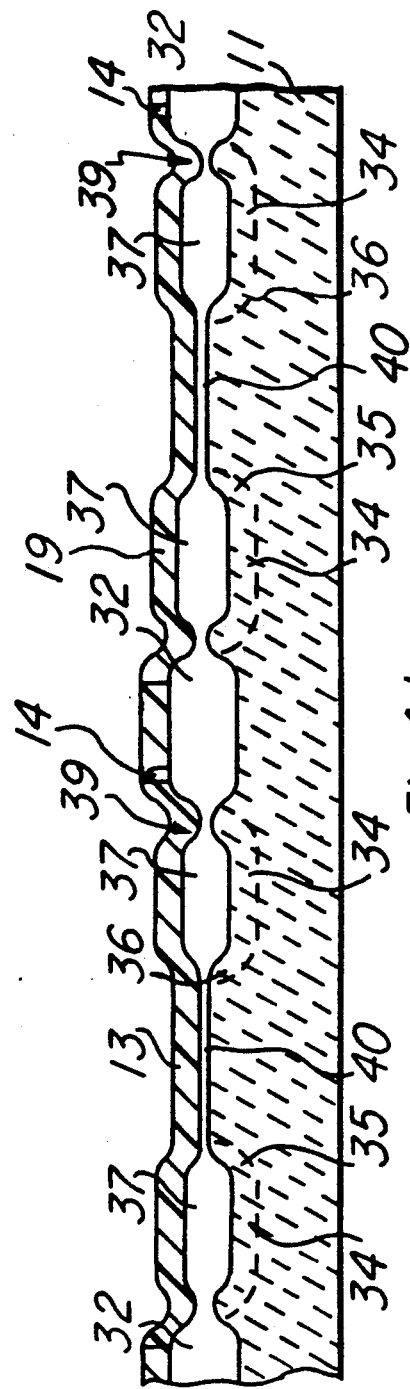

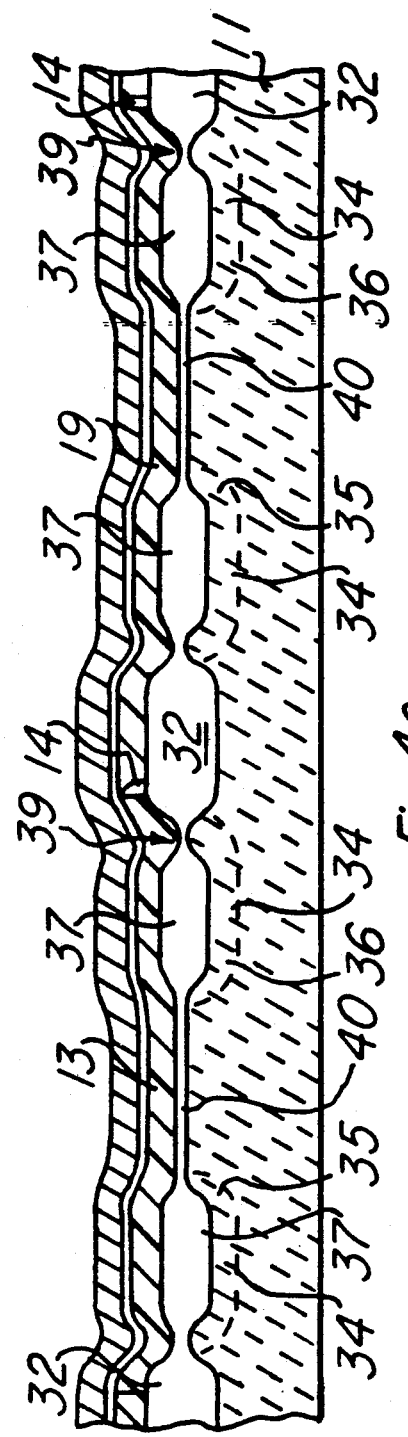

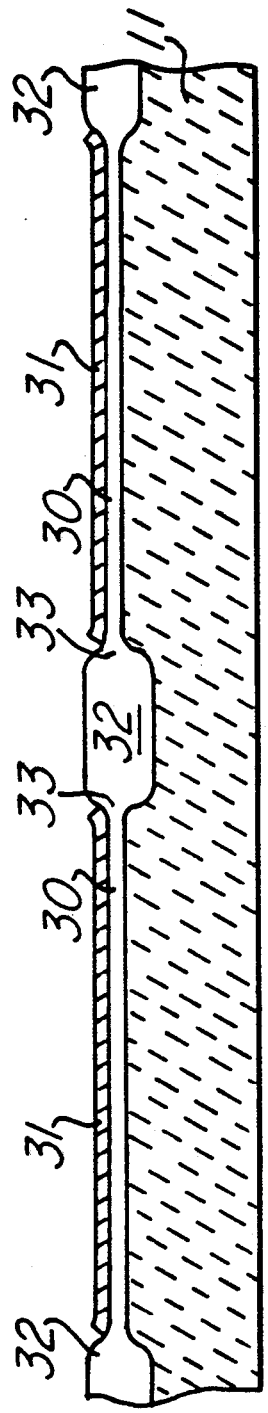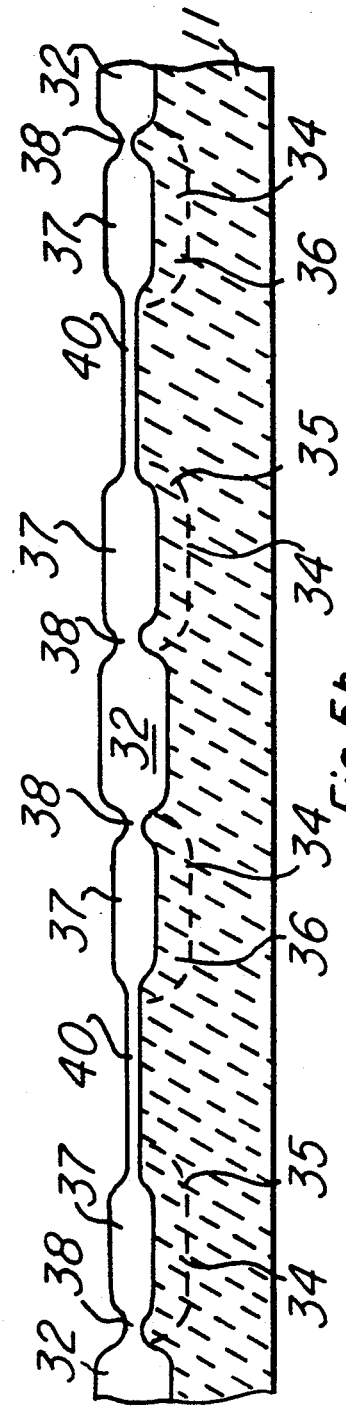

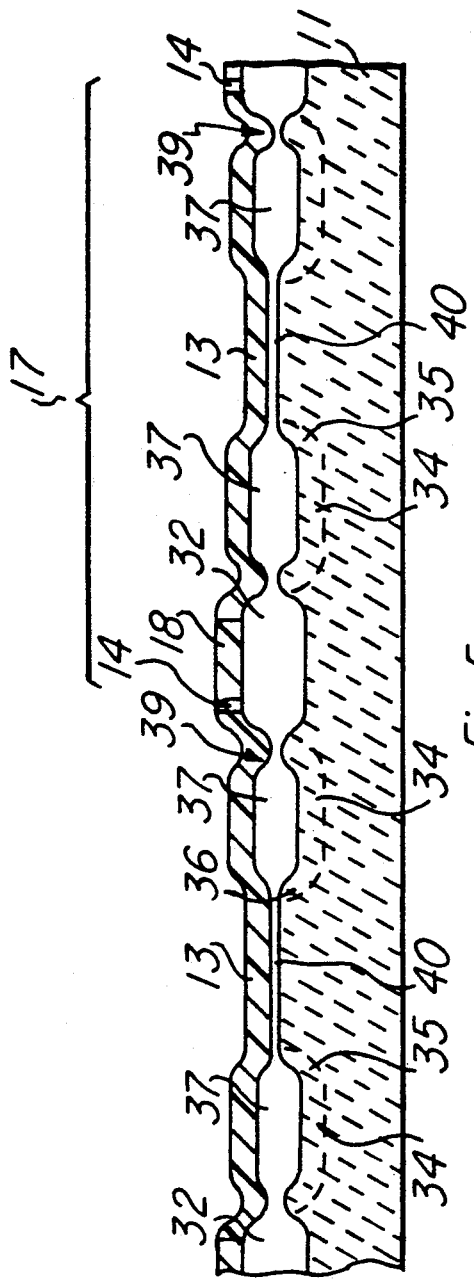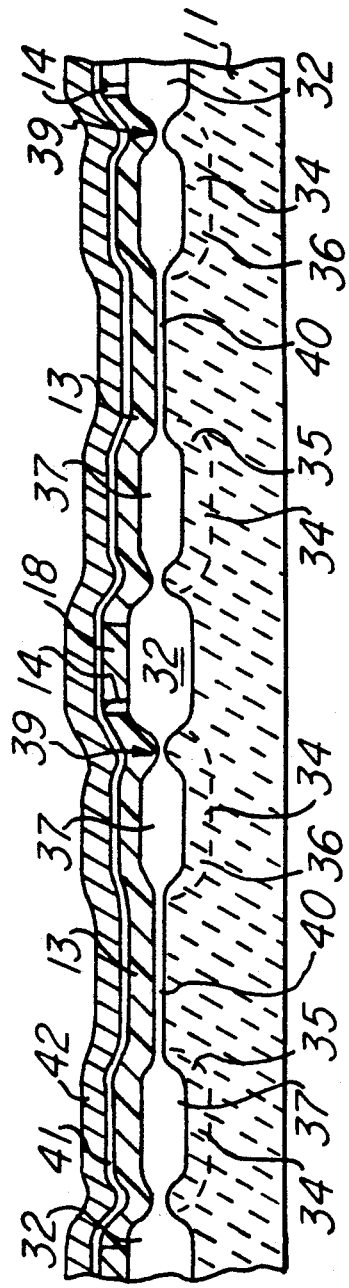

PROCESS FOR MINIMIZING LATERAL DISTANCE BETWEEN ELEMENTS IN AN INTEGRATED CIRCUIT BY USING SIDEWALL SPACERS

BACKGROUND OF THE INVENTION

This invention relates to a process for reducing the lateral distance between elements formed at the same level in an integrated circuit such that the lateral distance is less than the minimum distance that may be attained using standard photolithographic processes.

The lateral separation distance between conductive or other elements at the same processing level, such as gates and wordlines, of integrated circuits when using conventional photolithographic process is generally limited to the minimum processing dimension permitted by the photolithographic process used. That is, if the minimum distance between photoresist strips deposited on a semiconductor strip is one-half micron, then the minimum distance between gates of adjacent memory cells, and/or between wordlines associated with adjacent rows of cells, is also one-half micron.

It is desirable to decrease the spacing between identical components of integrated circuits. For example, the capacity of a memory array on a microchip may be increased by decreasing the distance between identical elements of adjacent memory cells. It is also desirable in some applications to increase the capacitive coupling between conductive elements by increasing the size of those elements to the maximum possible dimension for a given cell size.

SUMMARY OF THE INVENTION

The process of this invention permits the distance between adjacent elements to be less than the minimum dimension permitted by the particular photolithographic process used to manufacture an integrated circuit. Therefore, component density may be increased and/or the capacitive coupling between conductive elements may be increased over that of prior art processes.

The process includes patterning a first layer of photoresist to form first lines of photoresist having substantially minimum lithographic widths, forming first elements between the first lines of photoresist, removing the photoresist, forming a sidewall member on each side edge of the first elements, forming a second layer of element material over the structure, and etching to electrically insulate the first elements and the second elements at the sidewall members.

In a second embodiment of the invention, the structure is coated with another layer of photoresist after formation of sidewall member on each side of the first elements. The layer of photoresist is patterned to form second photoresist lines that cover alternating sidewall members. The exposed sidewall members are removed. Strips of first element material are formed between the second photoresist lines. After removal of the second photoresist lines, the structure is etched as before. However, in this embodiment, lateral extensions of the first elements are formed. The combined elements are separated by the remaining sidewall member.

BRIEF DESCRIPTION OF THE DRAWINGS

The novel features of this invention are set forth in the appended claims. The invention, its features, and its advantages are described below in conjunction with the following drawings:

FIG. 3 is a plan view of a small part of a semiconductor chip having memory cells according to one embodiment of this invention.

FIGS. 4a-4e are elevation views in section of the semiconductor device of FIG. 3 at various stages of construction taken along lines 3—3 of FIG. 3 and illustrating use of the process of FIGS. 1a-1d.

FIGS. 5a-5f are elevation views in section of the semiconductor device of FIG. 3 at various stages of construction taken along lines 3—3 of FIG. 3 and illustrating use of the process of FIGS. 2a-2e.

DETAILED DESCRIPTION OF THE SPECIFIC EMBODIMENT

Figure 1A:
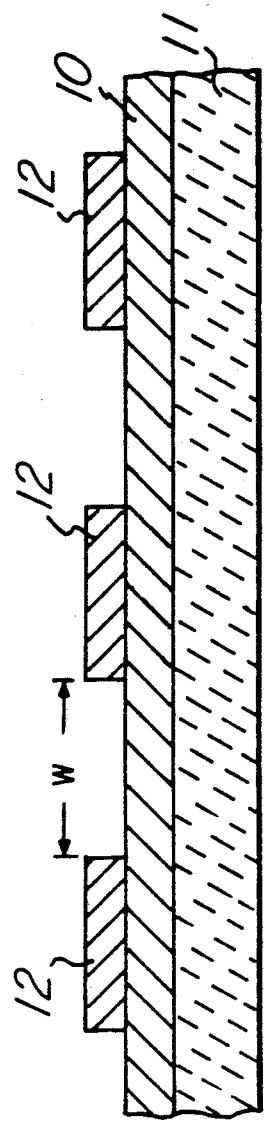
FIGS. 1a-1d are elevation views in section illustrating an embodiment of the process of this invention.

Referring to FIG. 1a, a layer 10 of either conductive or non-conductive material is formed on a face of an integrated circuit structure 11. The face of the integrated circuit structure 11 may include non-conductive material. Conductive material, whether resistive or not, may include such materials as doped polycrystalline silicon (polysilicon) or metal. Nonconductive material may include such materials as silicon oxide or undoped polysilicon. Layer 10 is coated with a layer 12 of photoresist, which is patterned to form at least one space having width W between lines of photoresist. Width W may be the minimum width, perhaps 0.8 micron, permitted by the photolithographic process.

Figure 1B:
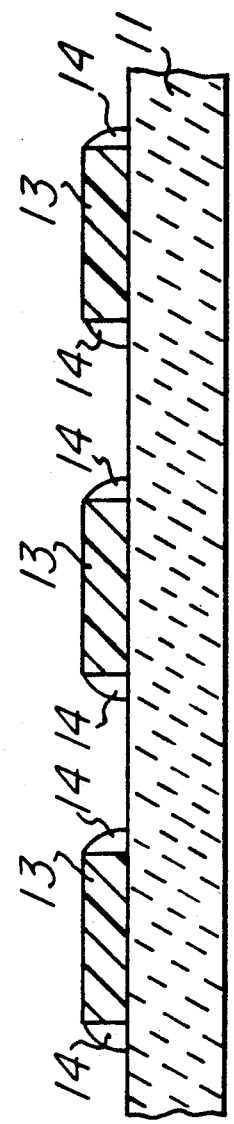

Layer 10 is then etched to form at least one space having approximately the same width W between first elements 13, which are formed from layer 10, as shown in FIG. 1b. Photoresist material 12 is removed and a layer of insulating material or conductive material is then formed over first elements 13, then etched in a manner well known in the art to form sidewall members 14 adjacent the sides of first elements 13. Insulating material that may be used to form sidewall members includes silicon dioxide. Conductive material that may be used to form sidewall members includes undoped polysilicon.

Figure 1C:
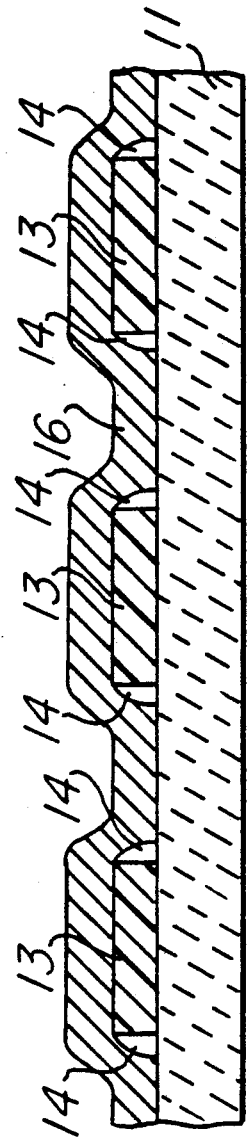

As shown in FIG. 1c, a second layer 16 of conductive or nonconductive material, of the same type as layer 10 is deposited on the surface of the wafer.

Figure 1D:
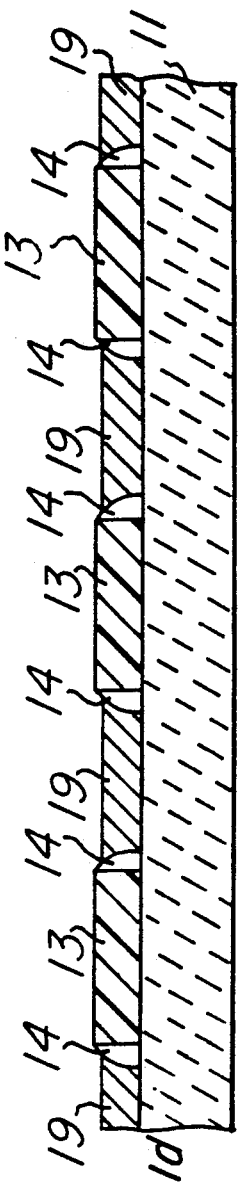

Finally, second layer 16 is etched to form a planar surface, as illustrated in FIG. 1d. The etching is performed according to well-known etch-back procedures and leaves at least one first element 13 electrically insulated from a second element 19 in the lateral direction by sidewall members 14, which are of sublithographic width.

Referring to FIG. 2, a second embodiment of the process of this invention is illustrated. In FIG. 2a, a layer 10 of conductive or non-conductive material is formed on a face of an integrated circuit structure 11, as was also described in reference to FIG. 1a. Layer 10 is coated with a layer 12 of photoresist, which is patterned to form at least one space having width W between lines of photoresist. As in FIG. 1a, width W may be the minimum width, perhaps 0.8 micron, permitted by the photolithographic process.

Figure 2A:
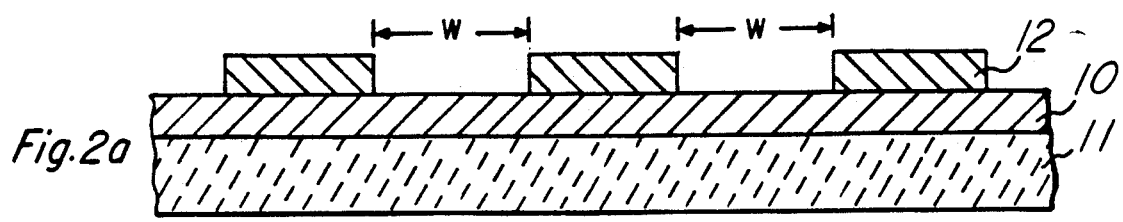
FIGS. 2a-2e are elevation views in section illustrating a second embodiment of the process of this invention.
Figure 2B:
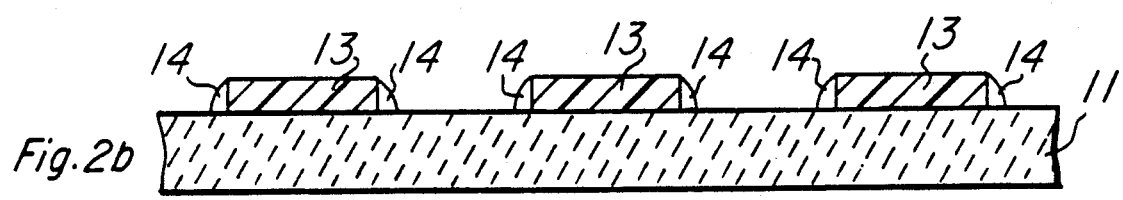

Layer 10 is then etched to form at least one space having approximately the same width W between first element 13, as shown in FIG. 2b. Photoresist material 12 is removed and a layer of insulating material is then formed over the first elements 13, then etched in a manner well known in the art to form sidewall members 14 adjacent the sides of first elements 13.

Figure 2C:
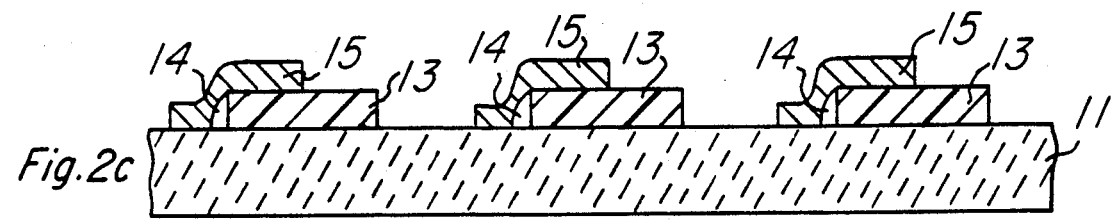

The structure is again covered with a layer of photoresist 15. This layer of photoresist is patterned to cover sidewall members 14 on one edge of each of first elements 13, as illustrated in FIG. 2c. The exposed sidewall members 14 on the other edge of each first elements 13 are removed by etching.

Figure 2D:
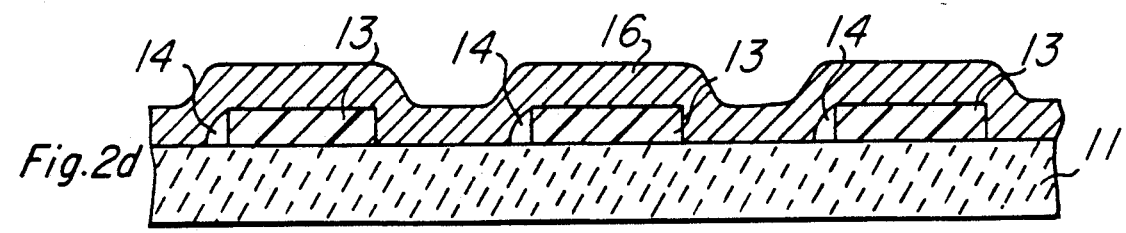

As shown in FIG. 2d, photoresist 15 is removed and a second layer 16 of conductive or non-conductive material of the same type as that of layer 10 is deposited on the surface of the wafer.

Figure 2E:
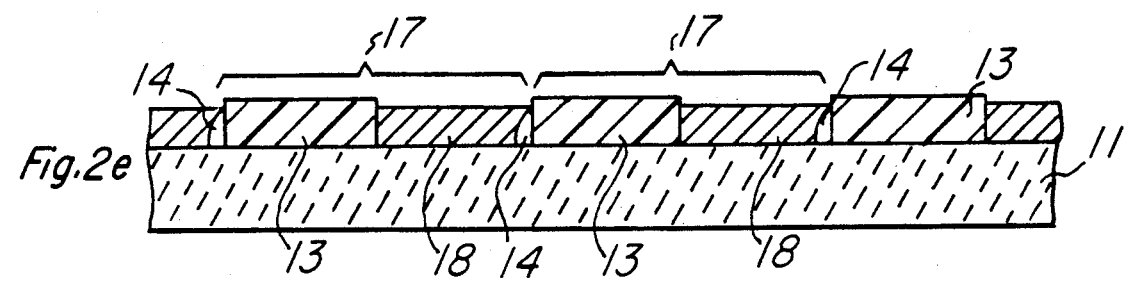

Finally, second layer 16 is etched to form a planar surface, as illustrated in FIG. 2e. The etching is performed according to well-known etch-back procedures and leaves at least combined element 17 formed from a first element 13 and an element extension 18, element extension 18 being formed from layer 16. Combined element 17 is electrically insulated from adjacent combined elements by sidewall members 14, which are of sublithographic width.

The width of sidewall members 14 may be increased, if needed, by forming double or triple sidewall members 14.

Referring now to FIGS. 3 and 4a–4e, an application of the procedure illustrated in FIG. 1 to fabrication of an array of electrically-erasable, electrically-programmable memory cells in a face of a substrate 11 is illustrated. The example process described hereinafter is a modification of the process described in U.S. patent application Ser. No. 07/360,558, filed June 6, 1989 and assigned to Texas Instruments Incorporated. Only a very small part of the substrate is shown in FIGS. 3 and 4a–4e, it being understood that these cells are part of an array of a very large number of such cells. While electrically-erasable, electrically programmable memory cells are used for illustration purposes, it should be understood that the process of this invention is equally applicable to all types of memory and other type integrated circuits, including dynamic random access memories and microprocessors.

The starting material is a slice of P-type silicon of which the substrate 11 is only a very small portion. The slice is perhaps 6 inches in diameter, while the portion shown in FIGS. 3 and 4a–4e is only a few microns wide. A number of process steps would be performed to create transistors peripheral to the array, and these will not be discussed here. For example, the memory device may be of the complementary field-effect type having N-wells and P-wells formed in the substrate as part of a prior process to create peripheral transistors. The first step related to the cell array of the invention is applying oxide and silicon nitride coatings 30 and 31 as seen in FIG. 4a, and patterning these coatings using photoresist to leave nitride layer 31 over what will be the channel regions, tunnel areas, sources, drains, and bitlines, while exposing the areas where the thick field oxide 32 is to be formed. A boron implant at about $8 \times 10^{12}$ cm$^{-2}$ dosage is performed to create a P+ channel stop beneath the field oxide 32. Then the field oxide is grown to a thickness of about 9000A by exposing to steam at about 900° C. for several hours. The thermal oxide grows beneath the edges of the nitride 31, creating a "bird's beak" 33 instead of a sharp transition.

Turning now to FIG. 4b, the nitride 31 is removed and, in the area where the bitlines 34 are to be formed, an arsenic implant is performed at a dosage of about $6 \times 10^{15}$ cm$^{-2}$ at 135 KeV, using photoresist as an implant mask, to create the bitlines 34, which include source/drain regions 35 and 36. Next, another thermal oxide 37 is grown on the face to a thickness of about 2500 to 3500A over the N+ buried bitlines, during which time a thermal gate oxide 40 of about 300A will grow over the channel areas (due to the differential oxidation occurring when heavily-doped and lightly-doped silicon areas are exposed to oxidation at the same time), to create the oxide layers 37 above the bitlines 34. This oxidation is in steam at about 800° to 900° C. At the transition areas 38 where the bird's beak 33 has been formed, the edge of the originally-formed thermal oxide 32 has masked the arsenic implant so the implanted impurity concentration is lower and so the oxide growth in that area is less than that of the oxide 37 or the oxide 32.

Referring to FIG. 4c, a window 39 is opened in the oxide in the transition area 38. This is done using photoresist as a mask, and etching through the oxide of transition area 38 to the bare silicon, then regrowing a thinner oxide for the tunnel window 39. During oxidation of tunnel window 39, gate oxide 40 over channel area will grow to approximately 350A. Optionally, an implant in the tunnel window 39 can be used to extend bitline regions 34 under window 39.

Because of the curved surface of transition area 38, the width of tunnel window 39 may be controlled by varying the length of time for the etch through transition area 38.

A first conductive layer, which may be of N+ doped polysilicon (and a layer of sacrificial nitride) and which corresponds to layer 10 of FIG. 1, is now applied to the face of the silicon slice 11 of FIG. 4b. The polysilicon layer (with nitride) is then coated with photoresist. The photoresist is patterned and the polysilicon layer (with nitride) is etched to form first elements 13 of conductive material, as shown in FIG. 4c. The photoresist material is then removed and a layer of oxide material is formed over first elements 13, then a directional etch is performed to form sidewall members 14 adjacent the edges of first elements 13, as is well-known in the art.

Etching and oxidation steps are performed to restore the 350A thickness to gate oxide 40 and 100A thickness to the oxide in tunnel window 39.

The structure of FIG. 4c is again covered with a second conductive layer (perhaps including a sacrificial nitride layer), which may also be of N+ doped polysilicon, corresponding to layer 16 of FIG. 2c. This second layer of polysilicon is then etched according to well-known etch-back procedures to leave first elements 13 electrically insulated from second elements 19 by sidewall members 14, illustrated in FIG. 4d. The sacrificial layers of nitride are removed. Elements 13 and 19 will become floating gates of the memory cells, which are separated in the X-direction by sidewall members 14. Note that the separation distance between adjacent elements 13 and 19 in the X-direction is the width of sidewall member 14, which is a sublithographic width.

Referring now to FIG. 4e, an oxide, or oxide-nitride-oxide, layer 41 is then deposited over what will become floating gates 13 and 19. A third conductive layer 42, which may also be of N+ doped polysilicon, is then deposited over insulating layer 41. The structure is then covered with a layer of photoresist which is patterned and subjected to an etching cycle such that layer 41, layer 42 and floating gate strips 13 and 19 are etched to form wordline/control gates 42 separated by insulator 41 from floating gates 13 and 19, as illustrated in FIG. 3. The elongated X-direction edges of the floating gates 13 and 19 are aligned with the edges of the wordline/control gates 42, although the edges illustrated in FIG. 3 are offset slightly for illustration purposes.

The structure is then covered with oxide, which is made planar. Contact holes are formed and metal conductors are formed over the oxide.

Figure 5C:
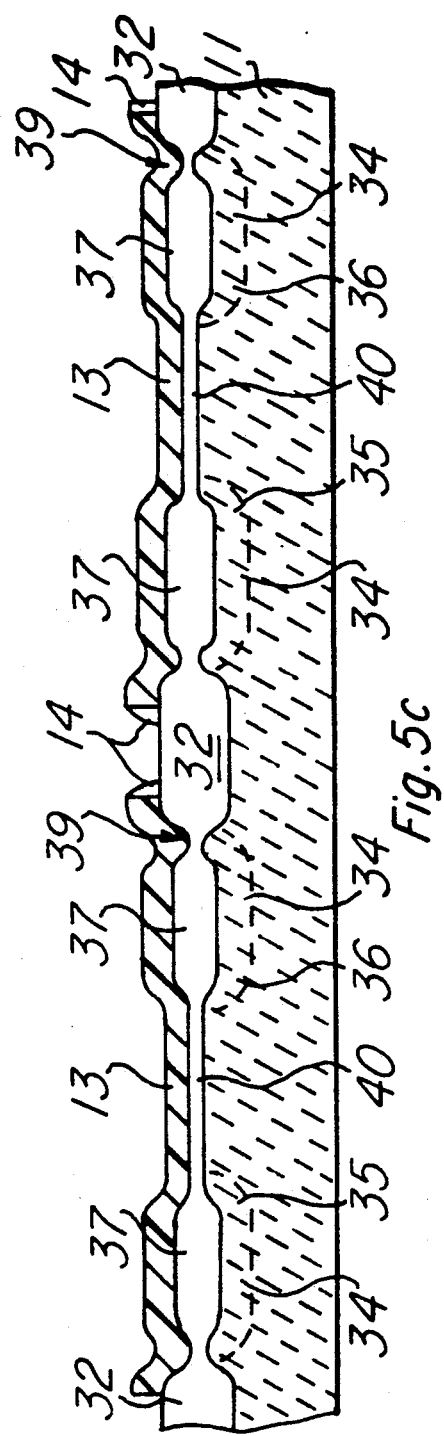

Referring now to FIGS. 3 and 5a–5f, an application of the procedure of FIG. 2 is used for fabrication of an array of electrically-erasable, electrically-programmable memory cells in a face of a substrate 11 is illustrated. The example process described hereinafter is also a modification of the process described in U.S. patent application Ser. No. 07/360,558, filed June 6, 1989 and assigned to Texas Instruments Incorporated. The process for forming the structure of FIGS. 5a, 5b and much of FIG. 5b is the same as that described above in conjunction with FIGS. 4a, 4b and 4c and, therefore, will not be repeated here.

Referring to FIG. 5c, a first conductive layer, which may be of N+ doped polysilicon and which corresponds to layer 10 of FIG. 2, is now applied to the face of the silicon slice 11 of FIG. 5b. The polysilicon layer is then coated with photoresist. The photoresist is patterned and the polysilicon layer is etched to form first elements 13 of conductive material, as shown in FIG. 5c. The photoresist material is then removed and a layer of oxide material is formed over first elements 13, then a directional etch is performed to form sidewall members 14 adjacent the edges of first elements 13, as is well-known in the art.

Figure 5D:
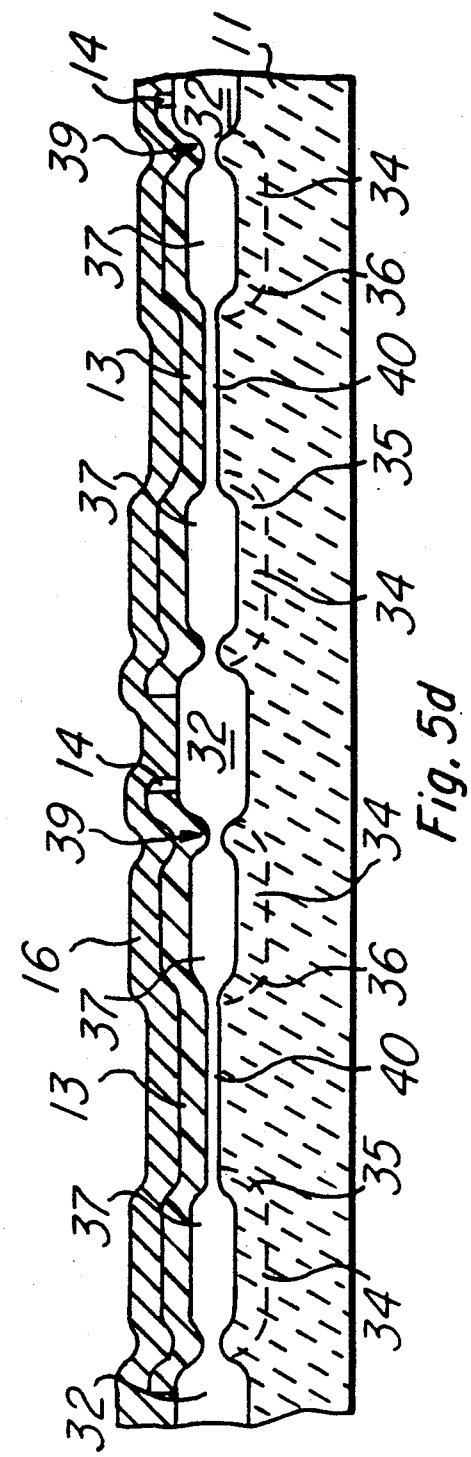

The structure of FIG. 5c is again covered with a layer of photoresist corresponding to layer 15 of FIG. 2c. This layer of photoresist is then patterned to cover the sidewall members 14 on one edge of each of first elements 13. The exposed sidewall members 14 on the other edge of each element 13 are removed by etching and, as shown in FIG. 5d, the resulting structure is covered with a second conductive layer 16, which may also be of N+ doped polysilicon.

As illustrated in FIG. 5e, the second conductive layer 16 is then directionally etched to remove those parts of conductive layer 16 above elements 13. Elements 13 and extensions 18, which will become floating gates of the memory cells, are separated in the X-direction by sidewall members 14. Note that the separation distance between adjacent combined elements 13 and 18 in the X-direction is the width of sidewall member 14, which is a sublithographic width.

As in the previous example, the width of sidewall member 14 may be increased, if needed, by forming double or triple sidewall members 14.

Referring now to FIG. 5f, an oxide, or oxide-nitride-oxide, layer 41 is then deposited over what will become floating gates 13 with extensions 18. A third conductive layer 42, which may also be of N+ doped polysilicon, is then deposited over insulating layer 41. The structure is then covered with a layer of photoresist which is patterned and subjected to an etching cycle such that layer 41, layer 42 and floating gate strips 13 with extensions 18 are etched to form wordline/control gates 42 separated by member 41 from floating gates 13 with extensions 18, as illustrated in FIG. 3.

It should be noted that the FIGS. are not drawn to scale and that, in particular, the thicknesses of the first and second polysilicon layers are generally much greater than the thicknesses of oxide layers 30, 40 and 41.

Isolation regions 43 of FIG. 3 may be of the field oxide type or of the self-aligned ion implant type, as described in the aforementioned U.S. patent application Ser. No. 07/360,558. If field oxide isolation is to be used, the field oxide regions 43 may be formed at the time that field oxide regions 32 are formed. If junction isolation is to be used for the isolating regions 43, a self-aligned ion implant step is performed using the stacked wordlines/control gates 42 and floating gates 13 with extensions 18 as a mask to create the isolating regions 43. For this purpose, boron is implanted at a dosage of about $10^{12}$ cm$^{-2}$, at about 70 KeV. After annealing and oxidation, this implant produces P+ regions in regions 43 very much like channel stop implants beneath field oxide.

An advantage of the floating gate memory cell structures described above is that isolation between cells in the X-direction is enhanced because the floating gates 13 with extensions 18 provide increased shielding against the wordline 42 electric field to the region under field oxide regions 32 as compared with prior-art structures.

Another advantage is that the capacitive coupling of wordline/control gates 42 to floating gates 13 with extensions 18 is improved because of the increased area between their juxtaposed conductive surfaces. Therefore, a greater fraction of the programming, erasing and reading voltages is coupled to the floating gate.

An alternative advantage is that the overall cell size can be reduced because the spacing between cells can be minimized without adversely affecting the coupling of programming and/or erasing voltages to the floating gates by decreasing the width of field oxide regions 32 in the X-direction.

Using the process of this invention, metal or polysilicon or silicided interconnecting conductors can also be spaced closer to each other in integrated circuits.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A process for forming sublithographic distances between elements in an integrated circuit, comprising:
   forming and patterning a first layer of photoresist to form first lines of photoresist over a face of an integrated circuit structure, said first lines having a minimum photolithographic width;
   forming first elements between said first lines of photoresist, each said first element having an upper surface and opposite edges;
   removing said first lines of photoresist;
   forming sidewall members on said opposite edges of each of said first elements, said sidewall members formed in a manner to expose said upper surfaces of said first elements;
   forming a layer over said structure; and etching said layer to form second elements separated from said first elements in the lateral direction by said sidewall members.

2. The process of claim 1, wherein said first elements and said second elements include conductive material and said sidewall members include non-conductive material.

3. The process of claim 1, wherein said first elements and said second elements include non-conductive material and said sidewall members include conductive material.

4. The process of claim 1, wherein said first elements and said second elements include doped polysilicon.

5. The process of claim 1, wherein said sidewall members include silicon dioxide.

6. The process of claim 1, wherein said first elements and said second elements are floating gates of memory cells.

7. The process of claim 1, wherein said face of said integrated circuit structure includes non-conductive material.

8. A process for forming sublithographic distances between combined elements in an integrated circuit, comprising:

forming and patterning a first layer of photoresist to form first lines of photoresist over a face of an integrated circuit structure, said first lines having a minimum photolithographic width;

forming first elements between said first lines of photoresist;

removing said first lines of photoresist;

forming sidewall members on opposite edges of each of said first elements;

forming and patterning a second layer of photoresist to form second lines offset from said first lines to cover alternate ones of said sidewall members and to leave uncovered remaining ones of said sidewall members;

removing said remaining sidewall members;

forming element extensions between said second lines of photoresist;

removing said second lines of photoresist; and etching to separate said combined elements, comprising said first elements and said element extensions, from adjacent said combined elements at said alternate ones of said sidewall members.

9. The process of claim 8, wherein said, wherein said first elements and said element extensions include conductive material and said sidewall members include non-conductive material.

10. The process of claim 8, wherein said first elements and said element extensions include non-conductive material and said sidewall members include conductive material.

11. The process of claim 8, wherein said first elements and said element extensions include doped polysilicon.

12. The process of claim 8, wherein said sidewall members include silicon dioxide.

13. The process of claim 8, wherein said first elements and said element extensions are floating gates of memory cells.

14. The process of claim 8, wherein said face of said integrated circuit structure includes non-conductive material.

* * * * *